(12) United States Patent
Wielgus et al.

(10) Patent No.: US 7,667,285 B2
(45) Date of Patent: Feb. 23, 2010

(54) PRINTED ELECTRONIC SUBSTRATE HAVINE PHOTOCHROMIC BARRIER LAYER

(75) Inventors: Jerzy Wielgus, Mount Prospect, IL (US); Daniel R. Gamota, Palatine, IL (US); John B. Szczech, Schaumburg, IL (US); Jie Zhang, Buffalo Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 609 days.

(21) Appl. No.: 11/610,771

(22) Filed: Dec. 14, 2006

(65) Prior Publication Data

US 2008/0142918 A1 Jun. 19, 2008

(51) Int. Cl.
*H01L 31/00* (2006.01)

(52) U.S. Cl. ............... 257/435; 257/E31.001

(58) Field of Classification Search .......... 257/435, 257/E31.001
See application file for complete search history.

(56) References Cited

U.S. PATENT DOCUMENTS

| | | | |
|---|---|---|---|
| 4,927,180 A * | 5/1990 | Trundle et al. ............... 283/70 |
| 6,437,346 B1 | 8/2002 | Goudjil |
| 6,963,437 B2 | 11/2005 | Bauer et al. |
| 7,202,006 B2 * | 4/2007 | Chopra et al. ............... 430/138 |
| 2004/0096666 A1 | 5/2004 | Knox et al. |
| 2005/0079386 A1 | 4/2005 | Brown, Jr. et al. |
| 2005/0136260 A1 | 6/2005 | Garcia |
| 2005/0156048 A1 | 7/2005 | Reed et al. |
| 2005/0224935 A1 | 10/2005 | Schaepkens et al. |
| 2006/0014099 A1 | 1/2006 | Faler et al. |
| 2006/0065989 A1 | 3/2006 | Druffel et al. |
| 2007/0053856 A1 * | 3/2007 | Ribi et al. ............... 424/61 |
| 2008/0167183 A1 * | 7/2008 | Hoekstra et al. ............... 503/201 |
| 2009/0062533 A1 * | 3/2009 | Walters et al. ............... 544/79 |

FOREIGN PATENT DOCUMENTS

| WO | WO2005030856 A1 | 4/2005 |
|---|---|---|
| WO | WO2005040011 A1 | 5/2005 |

* cited by examiner

*Primary Examiner*—Trung Dang

(57) ABSTRACT

A protective photochromic barrier film for a light-sensitive printed electronic substrate. Light-sensitive semiconductor devices on a dielectric substrate are electrically connected by conductors. A barrier layer containing photochromic dyes covers some or all of the light-sensitive semiconductor devices. Upon exposure to visible, infrared, or ultraviolet light, the photochromic dyes change chemical structure and decrease the amount of visible or non-visible light that can impinge upon the light-sensitive electronic devices. Upon removal of the visible or non-visible light, the photochromic dyes either revert to their original structure or maintain their altered state.

20 Claims, 2 Drawing Sheets

SECTION "A-A"

SECTION "A-A"

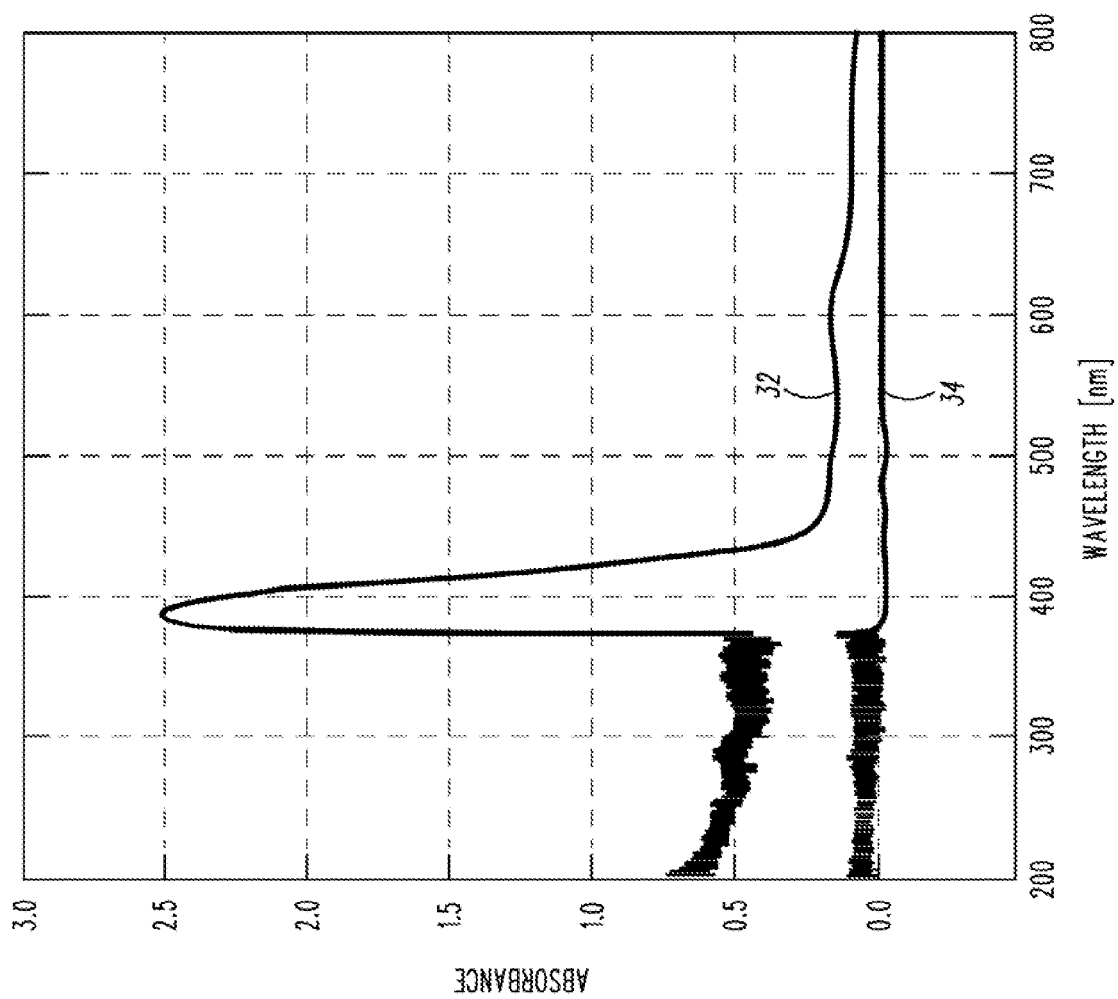

PRINTED ELECTRONIC SUBSTRATE HAVINE PHOTOCHROMIC BARRIER LAYER

FIELD OF THE INVENTION

The present invention relates generally to printed electrical circuitry, and more particularly, to printed electronic circuits having a protective cover layer responsive to electromagnetic radiation.

BACKGROUND

Electronic devices that contain semiconducting material are known to be occasionally susceptible to visible light. That is, photons impinging upon the semiconducting media can cause an anomalous electrical transference that can either damage the device or create spurious signals. Encapsulation of the devices by an optically opaque material prevents these problems, but not all semiconductor devices can be so protected. Encapsulation with opaque material hinders visual quality inspection and/or pattern recognition, and prevents light from emanating from the device. In addition, some light sensitive printed electronics have the unusual characteristic in which initial exposure to certain wavelengths of visible and/or non-visible light can be beneficial to their electrical performance. In these cases, a permanent light barrier is certainly not practical. But, in many devices, prolonged exposure to these certain wavelengths can be damaging, thus some sort of light barrier is desirable. Some have attempted to solve this dilemma by employing a mechanical shutter system in the prior art, but this is clearly not practical in today's world of miniature microelectronics.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 3 is a graph of absorbance vs. wavelength of conformal coatings with and without photochromic dyes in accordance with certain embodiments of the invention.

Figure 1:
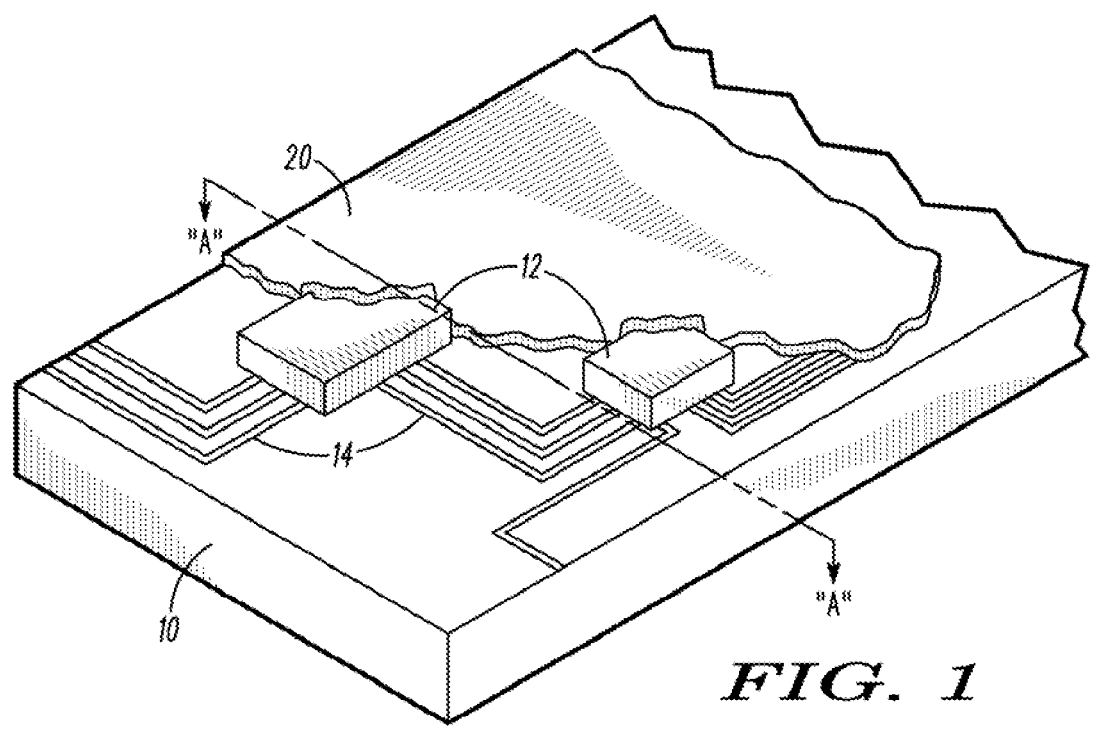
FIG. 1 is a cutaway isometric view of light sensitive circuitry protected by a photochromic barrier layer in accordance with some embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method and apparatus components related to photochromic barrier layers for printed electronic substrates.

Accordingly, the apparatus components and methods have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element. The use of the term "light" is intended to include light in the visible spectrum and light in the infrared (IR), near infrared, ultraviolet (UV), and far UV spectrums or portions thereof. The use of the term "semiconductor" is intended to include semiconductors having conventional inorganic materials and substrates such as silicon, germanium, gallium arsenide, etc. and also those having organic materials such as pentacene and carbon nanotubes, and organic components, such as electroluminescent portions.

It will be appreciated that embodiments of the invention described herein may be comprised of one or more conventional materials or processes. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such photochromic protected substrates with minimal experimentation.

Light-sensitive semiconductor devices on a dielectric substrate are electrically connected by conductors. A barrier layer containing photochromic dyes covers some or all of the light-sensitive semiconductor devices. Upon exposure to visible, infrared, or ultraviolet light, the photochromic dyes change chemical structure and decrease the amount of light that can impinge upon the light-sensitive electronic devices. Upon removal of the visible or non-visible light, the photochromic dyes either revert to their original structure or maintain their altered state.

Referring now to FIG. 1, a dielectric substrate 10 contains one or more light sensitive electronic devices 12 that are physically attached to the substrate. The devices 12 are electrically interconnected to each other and optionally to other devices (not shown) and/or to contacts or terminations (not shown) by a plurality of electrical conductors 14 in conventional manner. The electrical conductors 14 are situated on the substrate 10. The light sensitive devices 12 can be conventional semiconductor devices such as transistors, transistor arrays, silicon integrated circuit chips, or they may be printed organic components, such as emissive pixels or reflective pixels. Emissive and/or reflective pixels are formed on the substrate by a series of printing steps, such as screen printing, gravure printing, offset printing, inkjet, dispensing, and flexography. For example, a first electrode can be formed on the substrate, a dielectric layer printed on the first electrode, and an electroluminescent layer printed or laminated on the dielectric layer, and then one or more second electrodes can be disposed thereon to form electroluminescent pixels. These light sensitive electronic devices 12 are known to be occasionally susceptible to visible light. For example, photons impinging upon semiconducting media can cause an anomalous electrical transference that can either damage the device or create spurious signals. Further, some light sensitive printed electronics have the unusual characteristic in which initial exposure to certain wavelengths of visible and/or non-visible light can be beneficial to their electrical performance.

Figure 2:
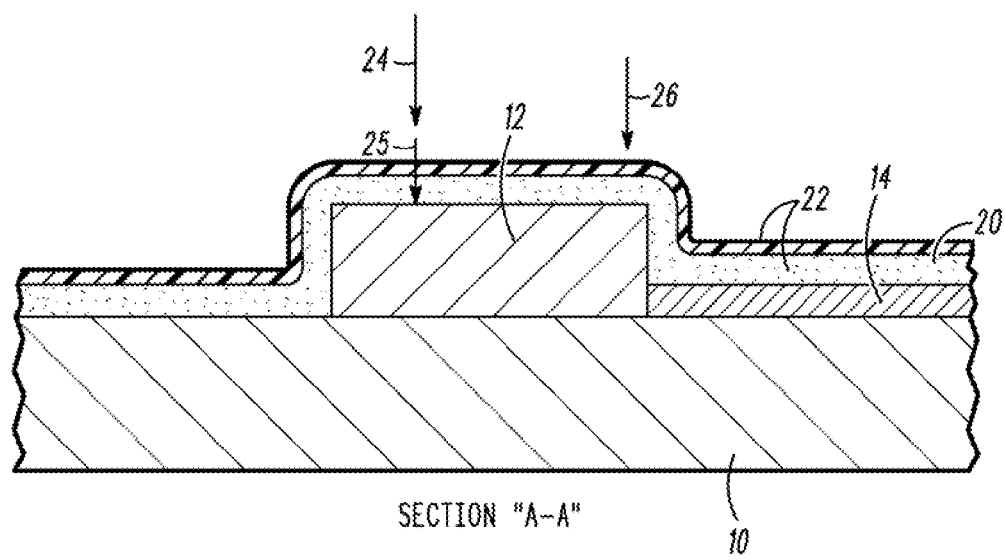
FIG. 2 is a cross-sectional view through section A-A of FIG. 1, of a photochromic barrier layer overlying light sensitive electronic components in accordance with some embodiments of the invention.

Referring now to FIGS. 1 and 2, the light sensitive devices 12 can be covered with a barrier layer 20 of material that filters selected wavelengths of light in order to protect the devices from these wavelengths of light. The barrier layer 20 is a polymer, a paper, or a conformal coating that contains one or more types of photochromic materials 22 that have a unique absorption spectra prior to being exposed to light. Suitable examples of materials that can be used for barrier layers are films or coatings made from polyesters, polyimides, polyamides, polyamide-imides, polyetherimides, polyacrylates, polyethylene terephthalate, polyethylene, polypropylene, polyvinylidene chloride, and polysiloxanes. As depicted in FIG. 2, the photochromic materials 22 can be incorporated as a coating on the surface of the barrier polymer 20, or they can be distributed 22 within the polymer matrix. One embodiment incorporates photochromic materials that have absorption spectra that effectively transmits light in the range of 320-650 nanometers (nm) when in a first state, but when exposed to ambient light, the photochromic materials undergo chemical conversion to another state that has a different absorption spectra, so as to decrease the amount of light at these selected wavelengths that might impinge upon the light-sensitive devices. Examples of photochromic materials that change chemical structure to absorb light are triarylmethanes, stilbenes, azastilbenes, nitrones, fulgides, spiropyrans, naphthopyrans, spiro-napthoxazines, and spiro-oxazines. To illustrate further, radiant light of selected wavelengths 24 reaching the barrier layer 20 when the photochromic material is in the first state passes unaltered through the photochromic material and the barrier layer to impinge 25 upon the light sensitive device 12. When a change in the ambient light environment occurs, the photochromic material changes chemical structure to a second state and the incoming light 26 is absorbed by the photochromic material, and the amount of light that impinges upon the light sensitive device is decreased. The amount of decrease in light can vary according to the amount and type of photochromic material that is incorporated in/on the barrier layer 20, and will range from less than 1% to a 90% decrease. When the ambient light environment reverts back to the initial state, the photochromic material can optionally revert back to the original chemical structure, thus transmitting the selected wavelengths of light again. Other photochromic materials exhibit the property of a permanent change in structure, and thus do not revert, thereby maintaining the amount of the selected wavelengths of light that reach the device at the reduced level. By judicious choice of chemistry, the designer can tailor the product to have the desired protective properties. To illustrate, we protected light sensitive printed organic semiconductor devices that had a peak absorptivity around 380 nm by forming a conformal coating containing the commercial photochromic material REVERSACOL, sold by Aqua Green (James Robinson, Item-No: 7539-R), wavelength 617 nm. The preferable type of photochromic dye will depend on they type of semiconductor used. In each case the absorptivity of photochromic film/coating should dominate over the absorptivity of semiconductor.

FIG. 3 shows the absorbance spectra for a conformal coating system both with a photochromic dye 32 and without a photochromic dye 34. As can be seen, substantial absorption occurs in the barrier system which contains photochromic dye around 400 nanometers.

In summary, reversible and/or non-reversible photochromic dyes are used in conjunction with transparent barrier materials to form films which enable a time controlled filtering of selected wavelength(s) of visible, infrared, or ultraviolet light. The resulting barrier material does not change the initial optical state of the barrier film, however the optical state is altered only after exposure to selected wavelengths of light. Likewise, the optical properties of the film return to its initial state once the source of radiation is removed. A wide range of wavelengths and optical dispersion kinetics can be employed to provide customization of the film based on the necessary product attributes. They can be tailored for a peak intensity absorbance ranging from 418 to 618 nm to create a "smart" barrier film system which can both "throttle" and selectively filter out these wavelengths for optimum printed electronics operation, resulting in optimum device performance without affecting the quality inspection processes.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A printed electronic substrate having photochromic material for protecting wavelength sensitive electronic devices, comprising:

a dielectric substrate having one or more active electronic devices situated thereon, said active electronic devices being responsive to selected wavelengths of visible or non-visible light;

a plurality of conductors situated on said dielectric substrate electrically connecting said active electronic devices; and a barrier layer overlying said active electronic devices, said barrier layer containing photochromic molecules to filter said selected wavelengths of light in response to changes in ambient light so as to protect said active electronic devices from said selected wavelengths of light.

2. The printed electronic substrate as described in claim 1, wherein the barrier layer comprises a polymer, paper, or conformal coating.

3. The printed electronic substrate as described in claim 2, wherein the barrier layer is one or more polymers selected from the group consisting of polyesters, polyimides, polyamides, polyamide-imides, polyetherimides, polyacrylates, polyethylene terephthalate, polyethylene, polypropylene, polyvinylidene chloride, and polysiloxanes.

4. The printed electronic substrate as described in claim 2, wherein the barrier layer further covers the plurality of conductors.

5. The printed electronic substrate as described in claim 1, wherein the one or more active electronic devices comprises a semiconductor device.

6. The printed electronic substrate as described in claim 1, wherein the one or more active electronic devices are selected from the group consisting of transistors, emissive pixels, and reflective pixels.

7. The printed electronic substrate as described in claim 1, wherein the photochromic molecules are selected from the group consisting of triarylmethanes, stilbenes, azastilbenes, nitrones, fulgides, spiropyrans, naphthopyrans, spiro-napthoxazines, and spiro-oxazines.

8. The printed electronic substrate as described in claim 1, wherein the photochromic molecules comprise a layer situated on the barrier layer.

9. The printed electronic substrate as described in claim 1, wherein the photochromic molecules are situated within the barrier layer.

10. A printed electronic substrate having photochromic material protecting wavelength sensitive electronic devices, comprising:
    a dielectric substrate having one or more active electronic devices situated thereon, said active electronic devices being at least partially responsive to selected wavelengths of visible or non-visible light;
    a plurality of conductors situated on said dielectric substrate electrically connecting said active electronic devices;
    a barrier film overlying said active electronic devices, said barrier film comprising one or more photochromic dyes; and
    wherein upon exposure to electromagnetic radiation of predetermined frequencies, the photochromic dyes change chemical structure so as to decrease the amount of said selected wavelengths of visible or non-visible light that can impinge upon said active electronic devices.

11. The printed electronic substrate as described in claim 10, wherein upon removal of the electromagnetic radiation of predetermined frequencies, the photochromic dyes revert to their original chemical structure.

12. The printed electronic substrate as described in claim 10, wherein upon removal of the electromagnetic radiation of predetermined frequencies, the photochromic dyes do not revert to their original chemical structure, and the amount of said selected wavelengths of visible or non-visible light that can impinge upon said active electronic devices remains in a decreased state.

13. The printed electronic substrate as described in claim 10, wherein the barrier film is one or more polymers selected from the group consisting of polyesters, polyimides, polyamides, polyamide-imides, polyetherimides, polyacrylates, polyethylene terephthalate, polyethylene, polypropylene, polyvinylidene chloride, and polysiloxanes.

14. The printed electronic substrate as described in claim 10, wherein the photochromic dyes are selected from the group consisting of triarylmethanes, stilbenes, azastilbenes, nitrones, fulgides, spiropyrans, naphthopyrans, spiro-napthoxazines, and spiro-oxazines.

15. A light-sensitive printed electronic substrate having a protective photochromic barrier film, comprising:
    a dielectric substrate having one or more light-sensitive semiconductor devices situated thereon, said light-sensitive semiconductor devices being at least partially responsive to selected wavelengths of visible or non-visible light;
    a plurality of conductors situated on said dielectric substrate electrically connecting said one or more light-sensitive semiconductor devices;
    a barrier layer overlying at least portions of said light-sensitive semiconductor devices, comprising one or more photochromic dyes having first absorption spectra;
    wherein upon exposure to electromagnetic radiation of predetermined frequencies, the photochromic dyes undergo chemical interconversion to a second state with second absorption spectra so as to decrease the amount of said selected wavelengths of visible or non-visible light that may impinge upon said light-sensitive semiconductor devices.

16. The printed electronic substrate as described in claim 15, wherein the barrier layer comprises a polymer, paper, or conformal coating.

17. The printed electronic substrate as described in claim 15, wherein the barrier layer is one or more polymers selected from the group consisting of polyesters, polyimides, polyamides, polyamide-imides, polyetherimides, polyacrylates, polyethylene terephthalate, polyethylene, and polypropylene, polyvinylidene chloride, and polysiloxanes.

18. The printed electronic substrate as described in claim 15, wherein the photochromic dyes are selected from the group consisting of triarylmethanes, stilbenes, azastilbenes, nitrones, fulgides, spiropyrans, naphthopyrans, spiro-napthoxazines, and spiro-oxazines.

19. The printed electronic substrate as described in claim 15, wherein upon removal of the electromagnetic radiation of predetermined frequencies, the photochromic dyes revert to their original chemical state.

20. The printed electronic substrate as described in claim 15, wherein upon removal of the electromagnetic radiation of predetermined frequencies, the photochromic dyes do not revert to their original chemical state, and the amount of said selected wavelengths of visible or non-visible light that may impinge upon said light-sensitive semiconductor devices remains at a decreased level.

* * * * *